(12) United States Patent
Benveniste (10) Patent No.: US 7,723,705 B2
(45) Date of Patent: May 25, 2010

(54) TECHNIQUES FOR MEASURING ION BEAM EMITTANCE

(75) Inventor: Victor M. Benveniste, Lyle, WA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 200 days.

(21) Appl. No.: 12/141,570

(22) Filed: Jun. 18, 2008

(65) Prior Publication Data

US 2009/0314932 A1  Dec. 24, 2009

(51) Int. Cl.
*H01J 37/317*  (2006.01)
*H01J 37/244*  (2006.01)
(52) U.S. Cl. .................. 250/492.21; 250/397
(58) Field of Classification Search ............ 250/492.21, 250/397
See application file for complete search history.

(56) References Cited

U.S. PATENT DOCUMENTS

| | | | |
|---|---|---|---|
| 6,677,598 B1* | 1/2004 | Benveniste | 250/492.21 |
| 7,064,340 B1* | 6/2006 | Vanderberg et al. | 250/492.21 |
| 7,381,977 B2* | 6/2008 | Pollock et al. | 250/492.21 |

FOREIGN PATENT DOCUMENTS

| | | |
|---|---|---|
| JP | H11-352236 A | 12/1999 |
| JP | 2000-294180 A | 10/2000 |

* cited by examiner

*Primary Examiner*—Jack I Berman (57) ABSTRACT

Techniques for measuring ion beam emittance are disclosed. In one particular exemplary embodiment, the techniques may be realized as an apparatus for measuring ion beam emittance. The apparatus may comprise a measurement assembly comprising a first mask, a second mask, and a pivot axis, such that the measurement assembly rotates about the pivot axis in order to scan an ion beam using either the first mask or the second mask to measure ion beam emittance for providing a measure of ion beam uniformity.

20 Claims, 6 Drawing Sheets

TECHNIQUES FOR MEASURING ION BEAM EMITTANCE

FIELD OF THE DISCLOSURE

The present disclosure relates generally to ion implantation and, more particularly, to techniques for measuring ion beam emittance.

BACKGROUND OF THE DISCLOSURE

Ion implanters are widely used in semiconductor manufacturing to selectively alter conductivity of materials. In a typical ion implanter, ions generated from an ion source are directed through a series of beam-line components which include one or more analyzing magnets and a plurality of electrodes. The analyzing magnets select desired ion species, filter out contaminant species and ions having undesirable energies, and adjust ion beam quality at a target wafer. Suitably shaped electrodes may modify the energy and the shape of an ion beam.

In production, semiconductor wafers are typically scanned with an ion beam. As used hereinafter, "scanning" of an ion beam refers to the relative movement of an ion beam with respect to a wafer or substrate surface.

An ion beam is typically either a "spot beam" having an approximately circular or elliptical cross section or a "ribbon beam" having a rectangular cross section. For the purpose of the present disclosure, a "ribbon beam" may refer to either a static ribbon beam or a scanned ribbon beam. The latter type of ribbon beam may be created by scanning a spot beam back and forth at a high frequency.

In the case of a spot beam, scanning of a wafer may be achieved by sweeping the spot beam back and forth between two endpoints to form a beam path and by simultaneously moving the wafer across the beam path. Alternatively, the spot beam may be kept stationary, and the wafer may be moved in a two-dimensional (2-D) pattern with respect to the spot beam. In the case of a ribbon beam, scanning of a wafer may be achieved by keeping the ribbon beam stationary and by simultaneously moving the wafer across the ribbon beam. If the ribbon beam is wider than the wafer, a one-dimensional (1-D) movement of the wafer may cause the ribbon beam to cover the entire wafer surface. The much simpler 1-D scanning makes a ribbon beam a desired choice for single-wafer ion implantation production.

However, ribbon beams, as well as spot beams, can suffer from intrinsic non-uniformity problems. For example, a ribbon beam may consist of a plurality of beamlets, wherein each beamlet may be considered, conceptually, as one spot beam. Although beamlets within a ribbon beam are directed in the same general direction, any two beamlets may not be directed in exactly the same direction. In addition, each beamlet may have an intrinsic angle spread. As a result, during ion implantation with a ribbon beam, different locations on a target wafer may experience different ion incident angles. Furthermore, the beamlets may not be evenly spaced within the ribbon beam. One portion of the ribbon beam where beamlets are densely distributed may deliver a higher ion dose than another portion of the ribbon beam where beamlets are sparsely distributed. Therefore, a ribbon beam may lack angle uniformity and/or dose uniformity.

Figure 1:
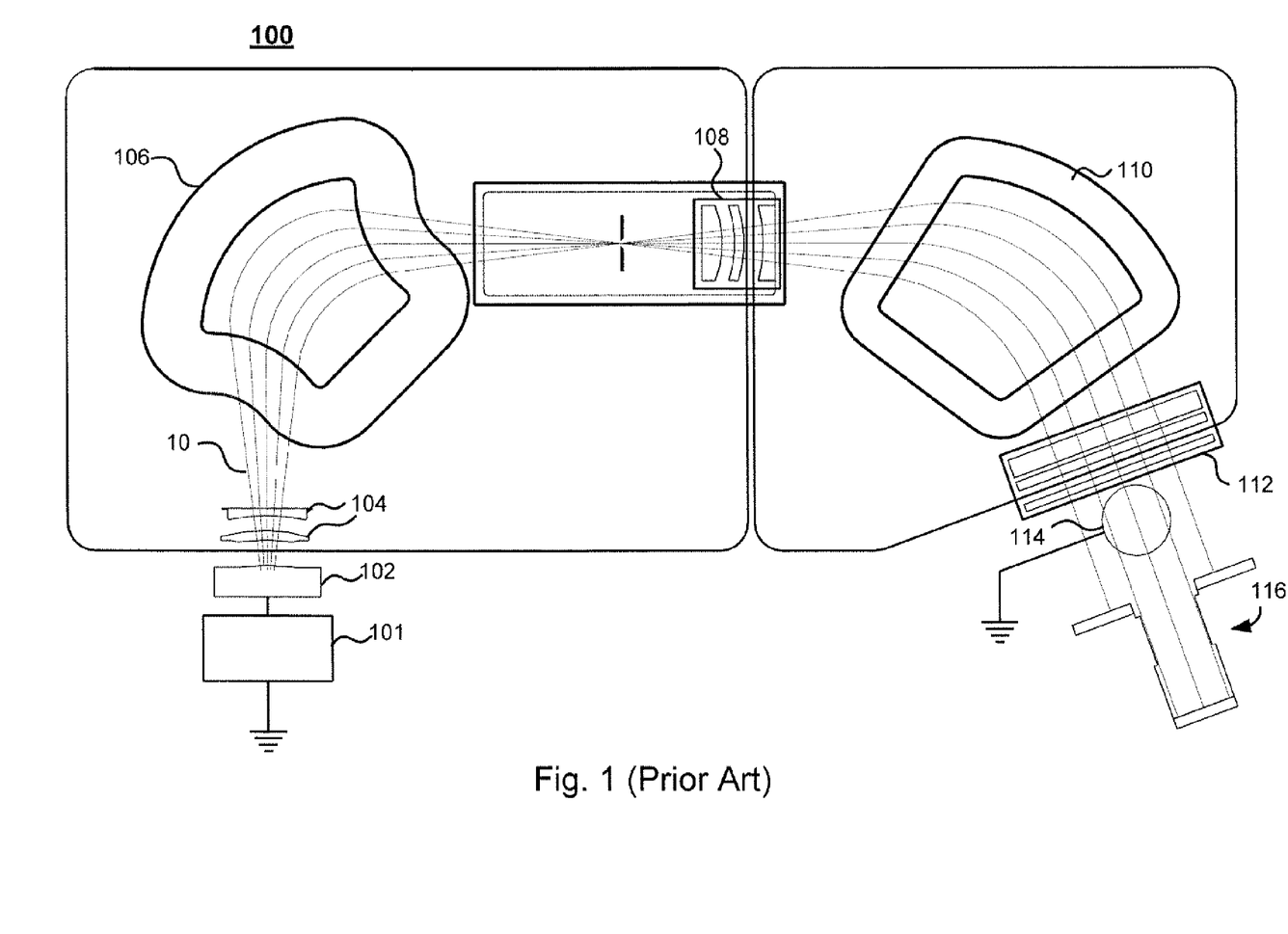
FIG. 1 depicts a conventional ion implanter system.

Ion beam angle uniformity and/or dose uniformity may be controlled by several ion implantation components. For example, electric and/or magnetic elements may be utilized. FIG. 1 shows a conventional ion implanter 100 comprising an ion source power supply 101, an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") may each comprise multiple electrodes with a defined aperture to allow an ion beam 10 to pass therethrough. By applying different combinations of voltage potentials to the multiple electrodes, the D1 and D2 deceleration lenses may manipulate ion energies and cause the ion beam 10 to hit a target workpiece 114 at a desired energy. A number of measurement devices 116 (e.g., a dose control Faraday cup, a traveling Faraday cup, or a setup Faraday cup) may be used to monitor and control characteristics of the ion beam 10. The above-mentioned D1 or D2 deceleration lenses may be electrostatic triode (or tetrode) deceleration lenses.

Significant changes in ion energies that take place in the electrostatic deceleration lenses can have a substantial impact on a shape of the ion beam 10. For example, space charge effects are more significant in low-energy ion beams than in high-energy ion beams. Therefore, a considerable number of ions may be lost before they reach the target wafer as when using low-energy ion beams. As a result, the effective dose and angle uniformity of the ion beam 10 may be substantially reduced.

There have been several attempts to reduce the above-described space charge effects in electrostatic triode lenses. For example, tuning voltages of deceleration lenses may help reduce space charge effects. However, because forces associated with space charge effects may be highly non-linear (especially if the ion beam 10 is not elliptical), tuning voltages of deceleration lenses may be very challenging without accurate tuning assistance to compensate for space charge effects. Another example may include using one or more magnetic elements (e.g., corrector bars) at entrance and/or exit regions of a magnetic deflector to improve uniformity across a target wafer.

Although these additional electric and/or magnetic components have been utilized in conventional ion implanters to somewhat improve either angle uniformity and/or dose uniformity of an ion beam, a more efficient solution has yet to be made available for providing ion beams that meet current dose and angle uniformity requirements for ion implantation production. For example, it is typically required that a ribbon beam should produce, in a wafer plane, a dose uniformity with less than 1% variation together with an angle uniformity with less than 0.5° variation. Such stringent uniformity requirements are becoming more difficult to meet since both types of uniformity may be elusive, especially in semiconductor manufacturing which require relatively high specificity and reliability.

In view of the foregoing, it may be understood that there are significant problems and shortcomings associated with current ion implantation technologies.

SUMMARY OF THE DISCLOSURE

Techniques for measuring ion beam emittance are disclosed. In accordance with one particular exemplary embodiment, the techniques may be realized as an apparatus for measuring ion beam emittance. The apparatus may include a measurement assembly comprising a first mask, a second mask, and a pivot axis, such that the measurement assembly rotates about the pivot axis in order to scan an ion beam using either the first mask or the second mask to measure ion beam emittance for providing a measure of ion beam uniformity.

In accordance with other aspects of this particular exemplary embodiment, the ion beam uniformity may include at least one of angle uniformity and dose uniformity.

In accordance with further aspects of this particular exemplary embodiment, the first mask and the second mask may be separated by a distance and wherein the first mask is parallel to the second mask.

In accordance with additional aspects of this particular exemplary embodiment, the measurement assembly may be rotatable into a parked position, such that in the parked position, the first mask and the second mask are parallel to the ion beam.

In accordance with other aspects of this particular exemplary embodiment, the measurement assembly may be rotatable into one or more measurement positions, such that the one or more measurement positions correspond to one or more configurations for measuring and collecting ion beam emittance for providing the measure of ion beam uniformity.

In accordance with further aspects of this particular exemplary embodiment, the first mask may include one or more first mask slits parallel to an Y-Z plane and wherein the second mask may include one or more second mask slits parallel to a X-Y plane.

In accordance with additional aspects of this particular exemplary embodiment, the measurement assembly may further include one or more first mask collectors corresponding to each of the one or more first mask slits of the first mask and one or more second mask collectors corresponding to each of the one or more second mask slits of the second mask.

In accordance with other aspects of this particular exemplary embodiment, in the one or more measurement positions, the ion beam emittance may be measured in at least the one or more first mask collectors when the first mask scans the ion beam and in at least the one or more second mask collectors when the second mask scans the ion beam.

In accordance with further aspects of this particular exemplary embodiment, the apparatus may further include one or more tuning elements for tuning ion beam uniformity.

In accordance with additional aspects of this particular exemplary embodiment, the one or more tuning elements may be at least one of electrostatic tuning elements and magnetic tuning elements.

In another particular exemplary embodiment, the techniques may be realized as a method for measuring ion beam emittance. The method may include rotating a measurement assembly comprising a first mask and a second mask about a pivot axis to measure ion beam emittance for providing a measure of ion beam uniformity.

In accordance with other aspects of this particular exemplary embodiment, rotating the measurement assembly may include rotating the measurement assembly about the pivot axis from a parked position to about 90 degrees in a clockwise direction.

In accordance with further aspects of this particular exemplary embodiment, the second mask may include one or more second mask slits parallel to an X-Y plane and one or more second mask collectors corresponding to each of the one or more second mask slits of the second mask.

In accordance with additional aspects of this particular exemplary embodiment, by rotating the measurement assembly, the ion beam emittance may be measured at the one or more second mask collectors when the second mask scans the ion beam.

In accordance with other aspects of this particular exemplary embodiment, rotating the measurement assembly may include rotating the measurement assembly about the pivot axis from a parked position to about 90 degrees in a counterclockwise direction.

In accordance with further aspects of this particular exemplary embodiment, the first mask may include one or more first mask slits parallel to an Y-Z plane and one or more first mask collectors corresponding to each of the one or more first mask slits of the first mask.

In accordance with additional aspects of this particular exemplary embodiment, by rotating the measurement assembly, the ion beam emittance may be measured at the one or more first mask collectors when the first mask scans the ion beam.

In accordance with other aspects of this particular exemplary embodiment, the ion beam uniformity may include at least one of angle uniformity and dose uniformity.

In accordance with further aspects of this particular exemplary embodiment, the method may further include tuning one or more tuning elements based on the ion beam emittance measurements.

In accordance with additional aspects of this particular exemplary embodiment, the one or more tuning elements may be at least one of electrostatic tuning elements and magnetic tuning elements.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure improve upon the above-described techniques by providing techniques for measuring ion beam emittance. More specifically, embodiments of the present disclosure provide techniques for measuring ion beam emittance by using a beam emittance measurement assembly in various configurations and/or positions so that beam emittance measurements may be used to control and tune ion beam angle and density uniformity in ion implantation operations.

Figure 2:
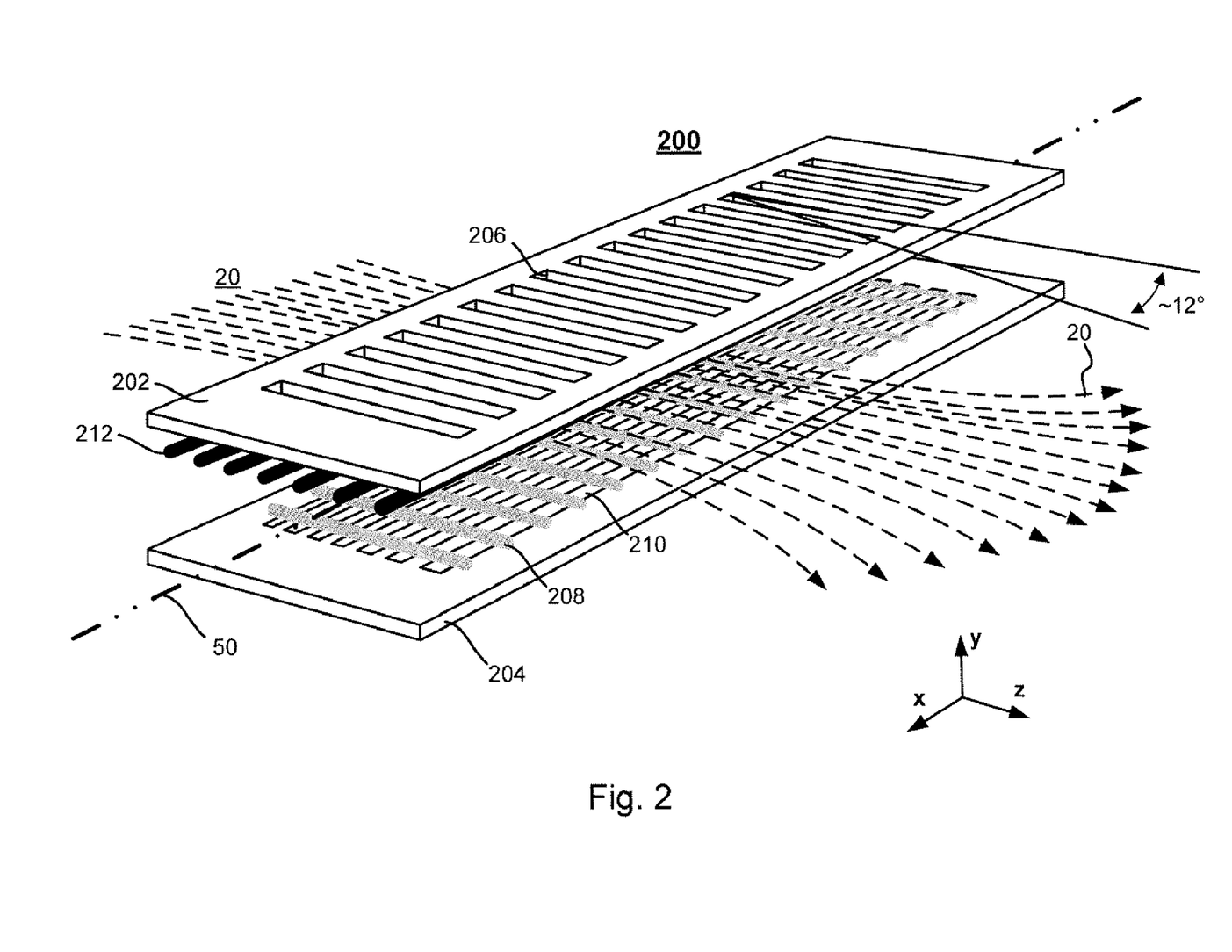
FIG. 2 depicts a beam emittance measurement assembly according to an embodiment of the present disclosure.

FIG. 2 depicts a measurement assembly 200 according to an embodiment of the present disclosure. For example, the measurement assembly 200 may be a beam emittance measurement assembly having an "X" mask ("X mask") 202 and a "Y" mask ("Y mask") 204. In one embodiment, the X mask 202 and/or the Y mask 204 may be formed of a graphite material. Graphite may be selected as a benign contaminant and for its superior mechanical and thermal properties. In another embodiment, the X mask 202 and/or the Y mask 204 may be formed of a dielectric material (e.g., ceramic or anodized aluminum). For example, if the measurement assembly 200 is located after a beam or wafer neutralizing device, such as a plasma flood gun, a measurement assembly 200 made of a dielectric material may help avoid introducing neutralizing electrons in an ion beam 20, which may potentially change beam shape during measurement. Other various embodiments may also be provided.

The X mask 202 may have a plurality of slits 206 propagating along a short direction of the X mask 202, herein after "x slits." In one embodiment, the x slits 206 may be approximately 0.1 mm in width. In another embodiment, the x slits 206 may be angled, e.g., 12° from the Y-Z plane. The measurement assembly 200 may also include a plurality of collectors 208, hereinafter "x collectors." In one embodiment, the x collectors 208 may be parallel to the X mask 202 and may correspond to the x slits 206. The x collectors 208 may be positioned some distance behind the x slits 206 opposite a pivot axis 50 near the Y mask 204. It should be appreciated that the x collectors 208 may be thin wires (e.g., approximately 0.1 mm thick) that may function as "x-axis acceptance planes" for collecting ion beam emittance measurements passing through the x slits 208. For example, in one embodiment, the x collectors 208 may be graphite rods (fragile) and/or tungsten wires. In another embodiment, materials used to form the x collectors 208 may also depend on desired collector dimensions, e.g., diameter, etc. It should also be appreciated that any conductive material may be used to form the x collectors 208. It should also be appreciated that tension ay be applied to the x collectors 208 to keep them substantially straight.

Similar to the X mask 202, the Y mask 204 may have a plurality of slits 210, hereinafter "y slits." However, unlike the x slits 206 of the X mask 202, the y slits 210 may propagate along a long direction of the Y mask 204. In one embodiment, the y slits 210 may be approximately 0.1 mm in width. In another embodiment, the y slits 210 may be angled, e.g., 12° from the X-Y plane. The measurement assembly 200 may also include a plurality of collectors 212, hereinafter "y collectors." In one embodiment, the y collectors 212 may be parallel to the Y mask 204 and may correspond to the y slits 210. The y collectors 212 may be positioned some distance behind the y slits 210 opposite the pivot axis 50 near the X mask 202. It should be appreciated that the y collectors 212 may be thin wires (e.g., approximately 0.1 mm thick) that function as "y-axis acceptance planes" for collecting ion beam emittance measurements passing through the y slits 210. For example, in one embodiment, the y collectors 212 may be graphite rods (fragile) and/or tungsten wires. In another embodiment, materials used to form the y collectors 212 may also depend on desired collector dimensions, e.g., diameter, etc. It should also be appreciated that any conductive material may be used to form the y collectors 212. It should also be appreciated that tension ay be applied to the y collectors 212 to keep them substantially straight.

It should be appreciated that the x collectors 208 and the y collectors 212 may be used to calculate at least one of dose, angle, and/or variance measurements of an ion beam 20. It should also be appreciated that the measurement assembly 200 may also be connected to one or more additional measuring devices, including, for example, a differential amplifier, a computer processors, etc. (none of which are shown), to assist in these calculations. Other various embodiments may also be realized.

It should also be appreciated that the measurement assembly 200 may be positioned along various locations along an ion beam path of an ion implanter. For example, the measurement assembly 200 may be positioned before deceleration lenses, after deceleration lenses, after a collimating magnet, or combinations thereof. Other various embodiments may also be provided.

It should also be appreciated that the measurement assembly 200 may be rotated along the pivot axis 50. For example, the measurement assembly 200 may be rotated about its axis by an actuator. In one embodiment, the actuator may provide direct rotation of the measurement assembly 200. In another embodiment, the actuator may provide via a indirect, e.g., by using a geared motor drive. In yet another embodiment, an accurate angle measurement device (e.g., a rotary encoder) may be used to rotate the measurement assembly 200 to a predetermined angular position at which emittance measurements may be collected. Such an angle may then be used to calculate x and y beam emittance and/or size. For example, as depicted in FIG. 2, the measurement assembly 200 may be in a "parked position," such that the ion beam 20 passes through the measurement assembly 200 without interference.

Figure 3:
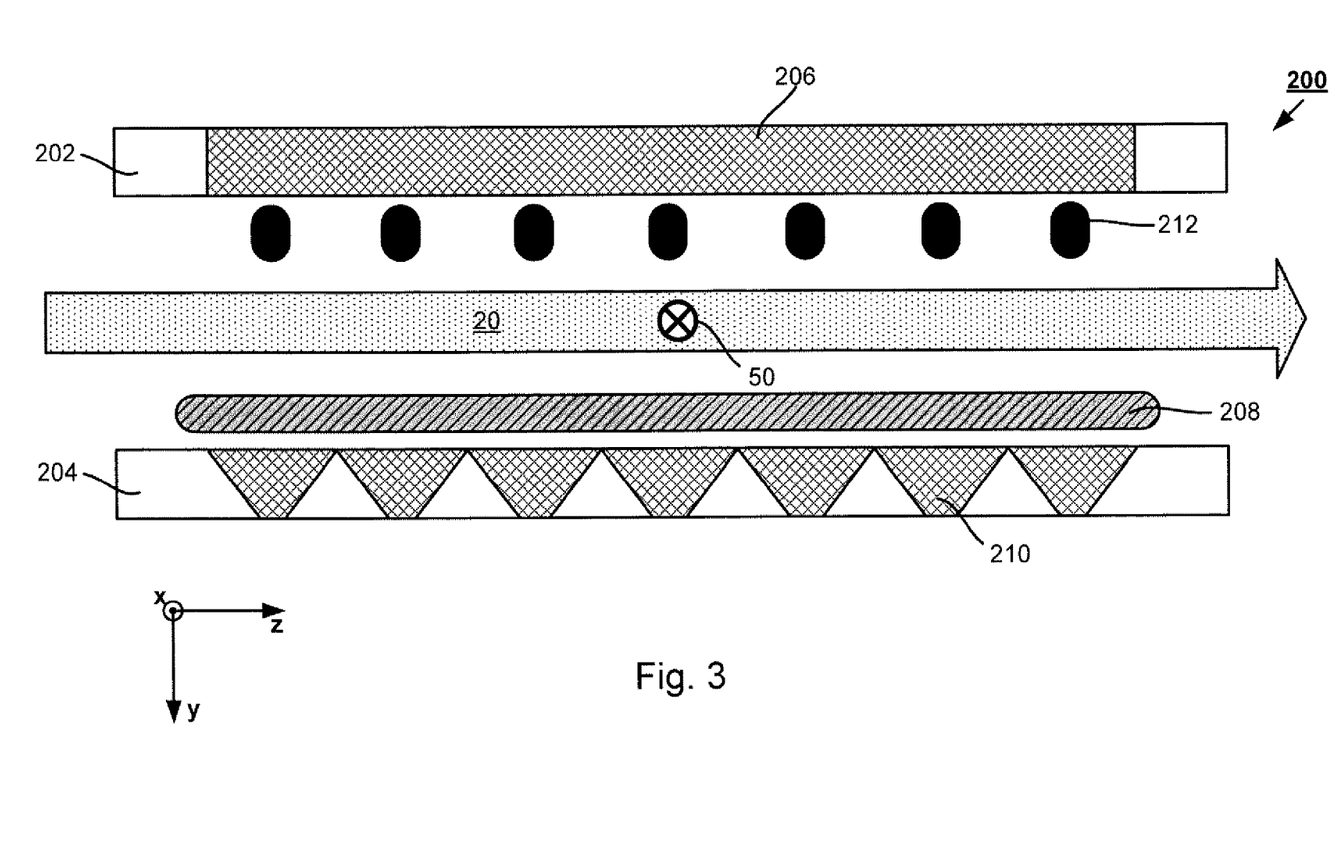
FIG. 3 depicts a Y-Z cross-section view of a beam emittance measurement assembly in a "parked position" according to an embodiment of the present disclosure.

FIG. 3 depicts an Y-Z cross-sectional view of the measurement assembly 200 in a "parked position" according to an embodiment of the present disclosure. In this example, the ion beam 20 may be parallel to planes of the X mask 202 and the Y mask 204 of the measurement assembly 200. However, in another embodiment, through a single rotary motion around the pivot axis 50, the measurement assembly 200 may intersect the ion beam 20 to collect ion beam emittance measurements. It should be appreciated that when rotated around the pivot 50, the measurement assembly 200 may intersect the ion beam 20 at various angles and/or collect a plurality of ion beam emittance measurements based on the x-axis acceptance planes, y-axis acceptance planes, or combinations thereof.

Figure 4:
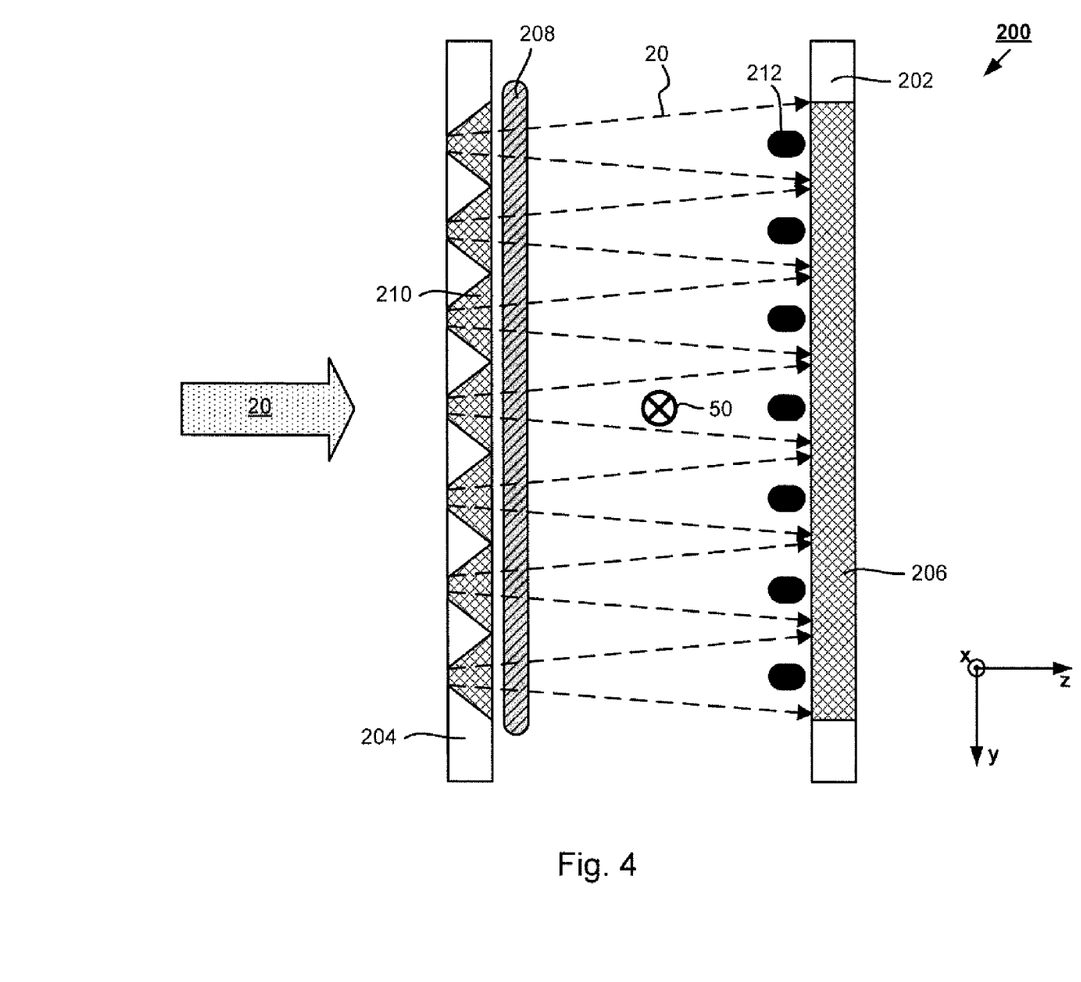
FIG. 4 depicts a Y-Z cross-section view of a beam emittance measurement assembly in a Y emittance measuring position according to an embodiment of the present disclosure.

For example, FIG. 4 depicts an Y-Z cross-sectional view of the measurement assembly 200 in a "measuring position" according to an embodiment of the present disclosure. In this example, the measuring position may be a Y emittance measuring position, in which the measurement assembly 200 has been rotated 90° (e.g., clockwise) from the parked position shown in FIG. 3. Here, the ion beam 20 may be orthogonal to the planes of the X mask 202 and Y mask 204 of the measurement assembly 200. The ion beam 20 may be intercepted by the measurement assembly 200, allowing only portions of ion beam 20 to pass through the y slits 210 to be collected at the y collectors 212.

In this example, the measurement assembly 200, via the y collectors 212, may collect beam emittance measurements and/or generate corresponding response curves (or other similar measurement formats). At each y collector 212, current density that is in the particular acceptance plane set by the tilt angle (e.g., y-axis acceptance plane) may be measured. By sweeping the tilt angle, for example, a series of ion beam densities at yy' points in phase space may be collected, as depicted in FIGS. 5A-5B.

Figure 5A:
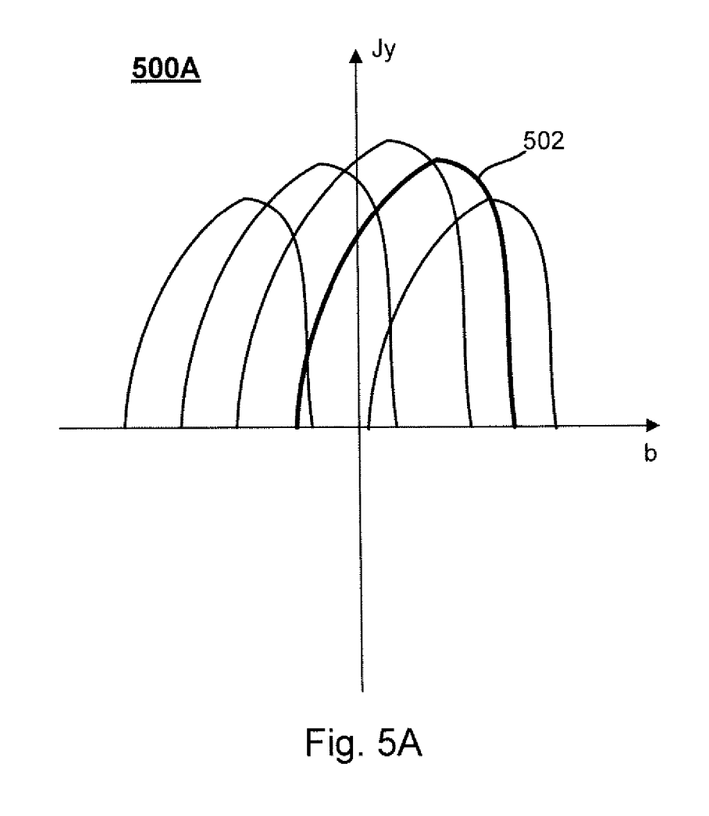
FIGS. 5A-5B depict illustrative graphs of current density profiles for a beam emittance measurement assembly according to an embodiment of the present disclosure.
Figure 5B:
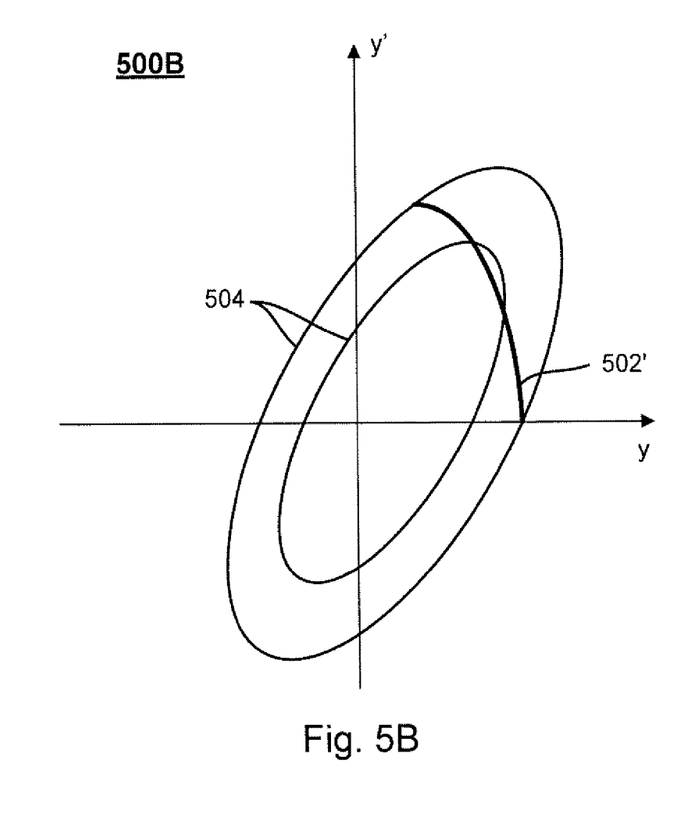

FIGS. 5A-5B depict illustrative graphs of current density profiles for a beam emittance measurement assembly 200 according to an exemplary embodiment of the present disclosure. At each angular position, the y coordinate of each of the y collectors 212 may be calculated. In addition, the y' acceptance angle defined by slit to wire orientation may also be calculated. Therefore, currents collected (e.g., beam densities Jy) may be plotted on a phase space graph 500A of FIG. 5A at the corresponding y,y' coordinates as angle may be varied across the desired range. A sufficiently high resolution Jy(y, y') plot may be generated via interpolation between measured points if necessary. Accordingly, from this Jy(y,y') plot, contour plots in which lines of equal density 504 may be calculated, as depicted in 500B of FIG. 5B. It should be appreciated that tilt angle may be represented by a and pivot angle represented by b, such that an X component of an acceptance plane with respect to the z axis may be expressed as: $x'=b*\tan(a)$.

Referring back to FIG. 5A, it should be appreciated that a small shift in y position of the y slits 210 may be taken into account when constructing a yy' density plot 502 in the reference frame of the fixed beam, as illustrated in graph 500A. Here, position (e.g., y position) of the y slits 210 and the y collectors 212 may be calculated from geometric dimensions of the measurement assembly 200 and relative angle to the beamline axis. Referring to FIG. 5B, a current density profile may be obtained by integration through all angles at each y coordinate in the yy' density plot of FIG. 5A. In this example, graph 500B depicts how each line curve 502 of FIG. 5A may translate into a line 502' (e.g., nearly vertical) in phase space within constant density contours 504.

It should be appreciated that these response curves may serve as a set of basis functions for tuning the ion beam 20. For example, the curves depicted in FIGS. 5A-5B may be used to tune the density profile of the ion beam 20.

In addition to collecting beam measurements in the form of response curves for tuning the density profile of the ion beam 20, the measurement assembly 200 may also measure the angles across the ion beam 20.

Figure 6:
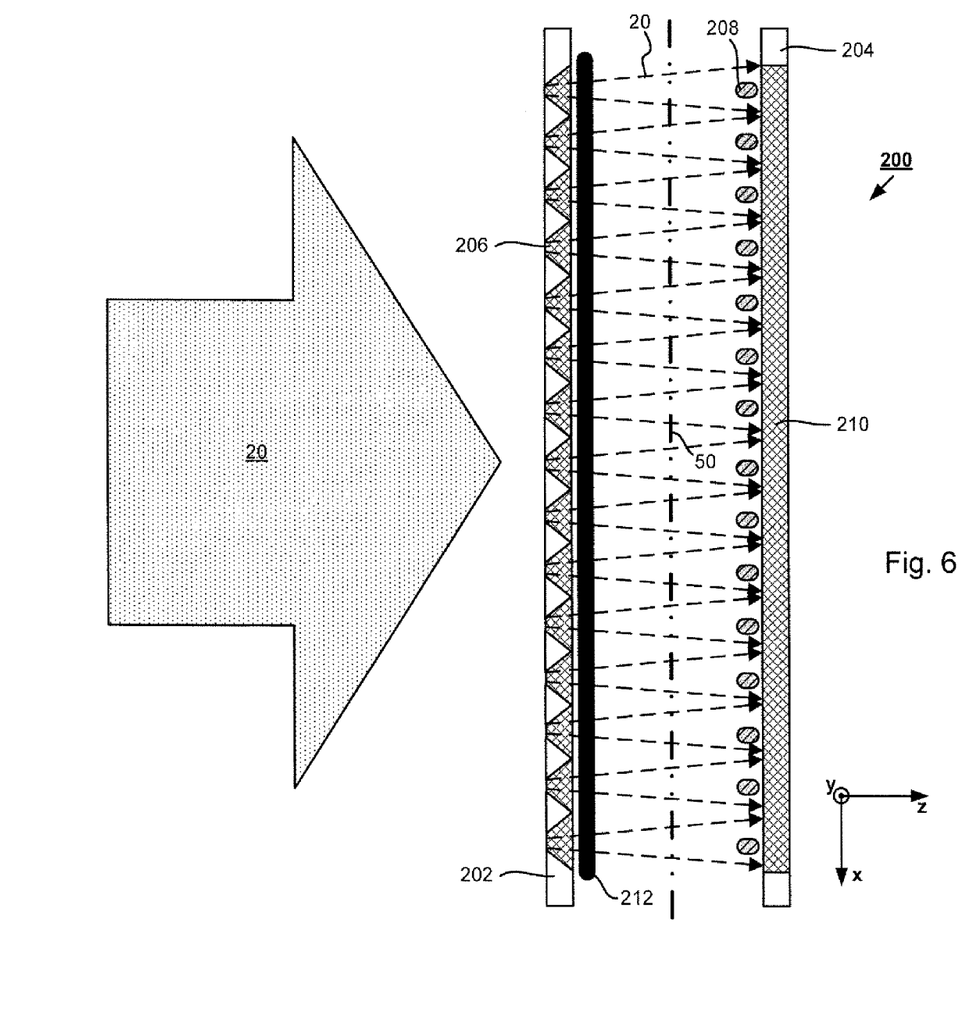
FIG. 6 depicts an X-Z cross-section view of a beam emittance measurement assembly in a X emittance measuring position according to another embodiment of the present disclosure.

FIG. 6 depicts an X-Z cross-sectional view of the beam emittance measurement assembly 200 in a measuring position according to another embodiment of the present disclosure. In this example, the measurement assembly 200 may be in an X emittance measuring position, in which the measurement assembly 200 has been rotated 90° (e.g., counterclockwise) from the parked position shown in FIG. 3. Here, the ion beam 20 may be orthogonal to the planes of the X mask 202 and Y mask 204 of the measurement assembly 200. The ion beam 20 may be intercepted by the measurement assembly 200, allowing only ion beam 20 portions passing through the x slits 206 to be collected at the x collectors 208.

It should be appreciated that in a nominal tilt position (e.g., the measurement assembly 200 perpendicular to an ion beam 20), acceptance planes may be inclined at a pivot angle b, which may be a small angle (e.g., 12°) from the vertical (y direction). The intersection of these acceptance planes with the X-Z plane may be parallel to the z-axis. Currents measured at this position may represent the density at x,0 (e.g., x'=0) in the xx' phase space.

As the assembly 200 is tilted away from this nominal tilt position, a pivot angle b develops between the acceptance plane and the z direction. This angle is due to an initial plane inclination (e.g. 12° from the vertical axis).

A projection of this angle onto the X-Z plane represents an x' coordinate (in phase space) corresponding to current measured at the collectors, e.g., the x collectors 208. Therefore, by sweeping the tilt angle, a series of xx' densities that are similarly translated into a contour plot in xx' phase space may be collected. It should be appreciated that small shifts in x positions of the x slit 206 intersecting with the X-Z plane may be taken into account in constructing the a xx' density plot in the fixed frame of reference of the beam. Here, position (e.g., x position) of the x slits 206 and the x collectors 208 may be calculated from geometric dimensions of the measurement assembly 200 and relative angle to the beamline axis.

As discussed above with regard to FIGS. 5A-5B, a density profile may be similarly obtained by integration through all angles at each x coordinate in the xx' density plot. However, it should be appreciated that collected x emittance may have some peculiarities. First, density profile resolution may be limited by a "smearing" effect of the angled slits 206. For example, spatial resolution may be equal to a height of the ion beam 20 (e.g., z axis) times a tangent of slit inclination. Accordingly, maintaining small angles for the angled slits 206 may help provide high spatial resolution.

Second, in practice, actual x' angular range may be equal to tilt angle range times a tangent of slit inclination, thereby representing a small range. This may be acceptable in the context of a low emittance beam, e.g., ion beam 20 having a small angular content at each spatial coordinate. These may include a generally parallel beam, or a fan beam emanating (or converging) from (or to) a narrow waist, such as in a ribbon beamline.

Third, the measurement assembly 200 may be, for example, tailored to the particular beam being measured: (1) at the end of a beamline where the beam is parallel, the x acceptance planes may be parallel to each other, or (2) in a location where the beam fans from a point, the acceptance planes intersect in a line that traverses that point. In this way, the small angular range of the measurement assembly 200 may be utilized to obtain precise angular measurements.

Embodiments of the present disclosure may provide techniques for measuring/collecting beam emittance measurements for optimizing tuning of ion implanter components (e.g., decel lenses) in a relatively short time period and for preserving productivity of ion implanters. For example, since accurate and rapid measurements of beam emittance near a target and/or at intermediate points in a beamline may greatly facilitate a tuning process and lead to a higher quality more intense beam at a target, embodiments of the present disclosure may provide an optimum tuning solution.

By using a simple and compact emittance measurement assembly that may be introduced almost anywhere in a beamline, in situ techniques for measuring and/or collecting xy emittance may be realized in a single measuring assembly utilizing a simple, yet precise, rotary motion.

Employing the measurement assembly 200 of the present disclosure may provide several additional benefits and advantages. For example, when a plurality of collectors (e.g., x collectors 208 or y collectors 212) is utilized, ion beam current measurements may provide dose, angle, variance, and/or other measurements as described above. Furthermore, these measurements may be in high resolution.

Additionally, by utilizing the single measurement assembly 200, rather than multiple measuring assemblies, to scan across the ion beam 20, reliable and consistent measurements may be taken of the ion beam 20. For example, the single measurement assembly 200 having a multiplicity of collectors as described above may be rather complex in design. Replicating the exact complexity of the measurement assembly 200 into multiple measurement assemblies and/or devices to scan the ion beam 20 without any trace of variation may not be possible. As a result, utilizing one measurement assembly 200 instead of multiple measurement assemblies having distinct (even if slight) variations in collector variation may provide distinct advantages. There are several other important design criteria as well.

For example, the measurement assembly 200 may be compact in size, have an ability to measure both angle and density profiles in high resolution, and be designed for flexible and customizable configurations. With regards to size, embodiments of the present disclosure may provide accurate measurements with approximately one (1) inch of beam length as compared to a "pepperpot" approach, which may require over ten (10) inches of beam length. Furthermore, some profiling in conjunction with the "pepperpot" approach may be too cumbersome to incorporate in a production beamline.

With regards to measurement benefits, the fact that the measurement assembly 200 of the present disclosure does not assume zero-emittance in order to yield accurate average angles, measurements may be achieved with great accuracy and in high resolution.

With regards to flexibility, if absolute current measurement is desired, electric/magnetic suppression and other add-on features may also be coupled to the measuring assembly configuration as well. These may include using electrostatic components (e.g., deceleration lenses) and/or magnetic components (e.g., magnetic coils, correctors). Other various measurement/tuning components may also be utilized.

It should be appreciated that measuring angle profile may be independent from measuring a density/dose profile. This may make it easier to tune/adjust the measurement assembly 200 to achieve a common (combined) goal of both angle and density uniformity.

It should be also appreciated that while embodiments of the present disclosure are directed to a beam emittance measurement assembly for measuring angle and beam uniformity, other implementations may be provided as well. For example, the disclosed techniques may apply to other various ion implantation systems that use other beam tuning systems (e.g., electric and/or magnetic deflection, etc.).

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. An apparatus for measuring ion beam emittance, the apparatus comprising:
a measurement assembly comprising a first mask, a second mask, and a pivot axis, wherein the measurement assembly rotates about the pivot axis in order to scan an ion beam using either the first mask or the second mask to measure ion beam emittance for providing a measure of ion beam uniformity.

2. The apparatus of claim 1, wherein the ion beam uniformity comprises at least one of angle uniformity and dose uniformity.

3. The apparatus of claim 1, wherein the first mask and the second mask are separated by a distance and wherein the first mask is parallel to the second mask.

4. The apparatus of claim 1, wherein the measurement assembly is rotatable into a parked position, such that in the parked position, the first mask and the second mask are parallel to the ion beam.

5. The apparatus of claim 1, wherein the measurement assembly is rotatable into one or more measurement positions, such that the one or more measurement positions correspond to one or more configurations for measuring and collecting ion beam emittance for providing the measure of ion beam uniformity.

6. The apparatus of claim 5, wherein the first mask comprises one or more first mask slits parallel to an Y-Z plane and wherein the second mask comprises one or more second mask slits parallel to a X-Y plane.

7. The apparatus of claim 6, wherein the measurement assembly further comprises one or more first mask collectors corresponding to each of the one or more first mask slits of the first mask and one or more second mask collectors corresponding to each of the one or more second mask slits of the second mask.

8. The apparatus of claim 7, wherein in the one or more measurement positions, the ion beam emittance is measured in at least the one or more first mask collectors when the first mask scans the ion beam and the one or more second mask collectors when the second mask scans the ion beam.

9. The apparatus of claim 1, further comprising one or more tuning elements for tuning ion beam uniformity.

10. The apparatus of claim 9, wherein the one or more tuning elements are at least one of electrostatic tuning elements and magnetic tuning elements.

11. A method for measuring ion beam emittance, the method comprising:
rotating a measurement assembly comprising a first mask and a second mask about a pivot axis to measure ion beam emittance for providing a measure of ion beam uniformity.

12. The method of claim 11, wherein rotating the measurement assembly comprises rotating the measurement assembly about the pivot axis from a parked position to about 90 degrees in a clockwise direction.

13. The method of claim 12, wherein the second mask comprises one or more second mask slits parallel to an X-Y plane and one or more second mask collectors corresponding to each of the one or more second mask slits of the second mask.

14. The method of claim 13, wherein by rotating the measurement assembly, the ion beam emittance is measured at the one or more second mask collectors when the second mask scans the ion beam.

15. The method of claim 11, wherein rotating the measurement assembly comprises rotating the measurement assembly about the pivot axis from a parked position to about 90 degrees in a counterclockwise direction.

16. The method of claim 15, wherein the first mask comprises one or more first mask slits parallel to an Y-Z plane and one or more first mask collectors corresponding to each of the one or more first mask slits of the first mask.

17. The method of claim 16, wherein by rotating the measurement assembly, the ion beam emittance is measured at the one or more first mask collectors when the first mask scans the ion beam.

18. The method of claim 11, wherein the ion beam uniformity comprises at least one of angle uniformity and dose uniformity.

19. The method of claim 11, further comprising tuning one or more tuning elements based on the ion beam emittance measurements.

20. The method of claim 19, wherein the one or more tuning elements are at least one of electrostatic tuning elements and magnetic tuning elements.

* * * * *